US008053029B2

(12) United States Patent
Shim et al.

(10) Patent No.: US 8,053,029 B2
(45) Date of Patent: Nov. 8, 2011

(54) METHOD FOR FABRICATING CUINS$_2$ THIN FILM BY METAL ORGANIC CHEMICAL VAPOR DEPOSITION, CUINS$_2$ THIN FILM FABRICATED BY THE SAME AND METHOD FOR FABRICATING IN$_2$S$_3$ THIN FILM THEREFROM

(75) Inventors: Il Wun Shim, Seoul (KR); Seung Soo Lee, Seoul (KR); Kook Won Seo, Seoul (KR); Jong Pil Park, Seongnam-si (KR)

(73) Assignees: Samsung SDI Co., Ltd., Yongin-si (KR); Samsung Electronics Co., Ltd., Suwon-si (KR); Seoul National University Industry Foundation, Seoul (KR); Chung-Ang University Industry-Academy Cooperation Foundation, Seoul (KR)

( * ) Notice: Subject to any disclaimer, the term of this patent is extended or adjusted under 35 U.S.C. 154(b) by 836 days.

(21) Appl. No.: 11/775,618

(22) Filed: Jul. 10, 2007

(65) Prior Publication Data

US 2008/0012015 A1    Jan. 17, 2008

(30) Foreign Application Priority Data

Jul. 14, 2006    (KR) ........................ 10-2006-0066427

(51) Int. Cl.
*C23C 16/00*    (2006.01)
*C23C 16/06*    (2006.01)

(52) U.S. Cl. ........... 427/248.1; 427/255.23; 427/255.28; 427/255.29; 427/255.31; 427/255.32; 427/255.34

(58) Field of Classification Search ............... 427/248.1, 427/255.23, 255.28, 255.29, 255.31, 255.32, 427/255.34

See application file for complete search history.

(56) References Cited

U.S. PATENT DOCUMENTS 3,356,527 A    12/1967    Moshier et al.
4,523,051 A    6/1985    Mickelsen et al.
(Continued)

FOREIGN PATENT DOCUMENTS

KR    1019950009445    8/1995
(Continued)

OTHER PUBLICATIONS

Kim et al. Bull. Korean. Chem. Soc. 2003, 24 (5) pp. 647-649.*

(Continued)

*Primary Examiner* — Kelly M Gambetta
(74) *Attorney, Agent, or Firm* — Christie, Parker & Hale, LLP

(57) ABSTRACT

Disclosed is a method for fabricating a CuInS$_2$ thin film by metal-organic chemical vapor deposition (MOCVD). The method comprises fabricating a copper thin film by depositing an asymmetric copper precursor on a substrate by MOCVD and fabricating a CuInS$_2$ thin film by depositing an indium-sulfur-containing precursor on the copper thin film by MOCVD. The method enables fabrication of a CuInS$_2$ thin film with a constant composition even under vacuum as well as an argon (Ar) atmosphere. Disclosed is further a CuInS$_2$ thin film fabricated by the method. Disclosed is further a method for fabricating an In$_2$S$_3$ thin film for a window of a solar cell via deposition of an indium-sulfur-containing precursor on the CuInS$_2$ thin film by MOCVD. Disclosed further is an In$_2$S$_3$ thin film fabricated by the method. The In$_2$S$_3$ thin film is useful for a substitute for CdS conventionally used for windows of solar cells and contributes to simplification in fabrication process of solar cells.

10 Claims, 6 Drawing Sheets

U.S. PATENT DOCUMENTS

| | | | |
|---|---|---|---|
| 4,761,269 A * | 8/1988 | Conger et al. | 118/679 |
| 5,045,409 A | 9/1991 | Eberspacher et al. | |
| 5,300,320 A | 4/1994 | Barron et al. | |
| 5,441,766 A | 8/1995 | Choi et al. | |
| 5,772,431 A | 6/1998 | Ikeya et al. | |
| 6,036,822 A | 3/2000 | Ikeya et al. | |
| 6,323,417 B1 | 11/2001 | Gillespie et al. | |
| 6,444,043 B1 | 9/2002 | Gegenwart et al. | |

FOREIGN PATENT DOCUMENTS

| | | |
|---|---|---|
| KR | 10220371 | 6/1999 |
| KR | 1020020059162 | 7/2002 |
| KR | 1020040088938 A | 10/2004 |

OTHER PUBLICATIONS

Speiring et al. Thin Solid Films, 431-432 (2003) pp. 359-363.*
Park et al. J. Mater. Chem., 2003, 13, pp. 1942-1949.*
O'Brien et al. Thin Solid Films, 315 (1998), pp. 57-61.*
Code II28P104, Meeting Abstract for 97th National Meeting; Korean Chemical Society; Apr. 20, 2006.
Krunks, et al.; "Structural and optical properties of sprayed CuInS2 films"; Thin Solid Films; vol. 338; pp. 125-130; 1999.
Korean Office Action dated May 21, 2007 for Application No. 10-2006-0066427.

* cited by examiner

METHOD FOR FABRICATING CUINS$_2$ THIN FILM BY METAL ORGANIC CHEMICAL VAPOR DEPOSITION, CUINS$_2$ THIN FILM FABRICATED BY THE SAME AND METHOD FOR FABRICATING IN$_2$S$_3$ THIN FILM THEREFROM

This non-provisional application claims priority under 35 U.S.C. §119(a) on Korean Patent Application No. 10-2006-0066427 filed on Jul. 14, 2006, which is herein incorporated by reference.

BACKGROUND OF THE INVENTION

1. Field of the Invention

The present invention relates to a method for fabricating a CuInS$_2$ thin film by metal-organic chemical vapor deposition (hereinafter, referred to as simply "MOCVD"), a CuInS$_2$ thin film fabricated by the method and a method for fabricating an In$_2$S$_3$ thin film from the CuInS$_2$ thin film. More specifically, the present invention relates to a method for fabricating a CuInS$_2$ thin film, the method comprising fabricating a copper thin film by depositing an asymmetric copper precursor on a substrate by MOCVD and fabricating a CuInS$_2$ thin film by depositing an indium-sulfur-containing precursor on the copper thin film by MOCVD. Furthermore, the present invention relates to a method for fabricating an In$_2$S$_3$ thin film for a window of a solar cell by depositing an indium-sulfur-containing precursor on the CuInS$_2$ thin film by MOCVD.

2. Description of the Related Art

Solar cells for converting solar energy into electric energy based on semiconductor characteristics attract much attention as representatives of environmentally friendly energy sources.

Crystalline silicon solar cells have the highest market share in solar cells. Although crystalline silicon solar cells have a possibility for cost reduction by means of mass-production, they utilize bulky silicon as a raw material, thus having a limitation in reducing material costs.

Accordingly, numerous studies have recently focused on development of solar cells that satisfy requirements of low cost, high efficiency and high reliability. In particular, thin film solar cells draw a great deal of attention as leading next-generation solar cells. Thin film solar cells can be fabricated using a small amount of materials through an integrated fabrication process, thus having a possibility for a reduction in fabrication costs.

Despite such circumstances, thin film solar cells have a complicated chemical structure and necessarily involve deposition of several micrometers of a plurality of ultra-thin films. For these reasons, a commercially successful technology for thin film solar cells has not yet been developed.

CuInS$_2$ thin films are composed of copper (Group 11, Cu), indium (Group 13, In) and sulfur (Group 16, S) in a ratio of 1:1:2. CuInS$_2$ thin films exhibit a variety of semiconductor characteristics, thus being widely used as major materials for magneto-optical memory devices, n- or p-type semiconductors, quantum dots, solar cells, etc. In an attempt to fabricate CuInS$_2$ thin films with low defects and superior quality, various methods have been recently reported. For example, Korean Patent Publication No. 2002-0059162 discloses a method for fabricating chalcogenide thin films with various compositions (e.g., (Ge$_a$Bi$_b$Sb$_c$)Te$_x$) via physical vapor deposition. Korean Patent No. 220,371 discloses fabrication of a CdS thin film using conventional chemical bath deposition (CBD). In addition, U.S. Pat. Nos. 6,036,822 and 5,772,431 disclose fabrication of chalcogenide thin films by electrodeposition which is a kind of electroplating method.

Further, U.S. Pat. Nos. 4,523,051, 5,045,409 and 6,444,043 disclose vacuum evaporation and close spaced sublimation. For the purpose of improvement in conventional evaporation using volatility at a high temperature, the vacuum evaporation employs simultaneous evaporation of metal compounds under vacuum to fabricate thin films at lower temperature.

The methods for fabricating thin films as mentioned above are divided into physical methods by means of phase transition such as physical vapor deposition (PVD) and vacuum evaporation, and chemical methods involving chemical reactions such as chemical bath deposition and electrodeposition.

Both the physical and chemical methods require complicated process conditions of low vapor pressure and constant solution concentration ratio to fabricate chalcogenide thin films having a specific composition. In addition, these methods have advantages of relatively low fabrication costs and simple fabrication equipment, but disadvantageously make it difficult to adjust a composition of chalcogenide to a desired level due to inherent characteristics thereof and to secure reproducibility in the thickness and uniformity of thin films.

In particular, vacuum evaporation necessarily involves deposition at a high temperature and high pressure, because chalcogen elements (e.g., S, Se and Te) are evaporated at a high temperature. Vacuum evaporation involves a complicated and troublesome procedure to deposit chalcogen elements with a desired composition due to different volatilities. In addition, vacuum evaporation has a problem of the necessity of the supplement of elements lost from deposition and subsequent thermal processing at a high temperature for phase formation [U.S. Pat. No. 6,323,417].

In addition, fabrication of thin films by chemical bath deposition is carried out by dipping a matrix in a solution and developing a thin film therein. The chemical bath deposition has general problems associated with wet processes and its application is limited to CdS thin films.

As a representative method to solve these problems, chemical vapor deposition (CVD) was suggested. Chemical vapor deposition (CVD) has advantages of uniform thin films, selective deposition, and small impurities. In addition, chemical vapor deposition (CVD) has another advantage in that thin films with a single composition can be reproductively fabricated through a simple process utilizing precursors having a constant composition. Based on these advantages, chemical vapor deposition (CVD) is widely utilized to fabricate semiconductors, e.g., metal electrodes, metal oxides, etc. However, chemical vapor deposition (CVD) requires pre-selection of metal and chalcogen elements in accordance with a specific composition, and sublimation characteristics of the precursors.

Accordingly, organometallic single precursors for chemical vapor deposition (CVD) of chalcogenide composed of constituent components with a constant composition must enable formation of a chemical complex containing a specific metal and chalcogen elements (e.g., S, Se or Te) with a constant composition, have desired volatility at a low temperature, be decomposed at a relatively low temperature, and readily form a chalcogenide phase after the decomposition due to their relatively superior thermal stability upon evaporation.

In recent years, as a result of a great deal of research on the organometallic single precursors, there was reported Group 11 copper (Cu) compound precursors comprising β-diketone or β-ketoester ligands having an alkyl group introduced in an alpha position thereof, and being coordinated to an ethylenediamine group through a Lewis base capable of imparting an unshared pair of electrons to a central copper II [Korean Patent Publication No. 1995-0009445, and U.S. Pat. Nos. 3,356,527 and 5,441,766].

In addition, there was reported organometallic single precursors comprising a chalcogen element introduced into a Group 13 metallic element, e.g., gallium (Ga), aluminum (Al) or indium (In) through a tert-butyl group [U.S. Pat. No. 5,300, 320]. However, these organometallic single precursors have problems in that various metals are particularly restricted in their use to fabricate chacogenide thin films involving the necessity of various components and compositions, and an insufficient content of highly volatile sulfur (S) or selenium (Se) is used in preparation of chalcogenide composed of multimetals, as similar to vacuum evaporation.

Recently, the present inventors have reported [$R_2M(\mu\text{-}ER_1)$]$_2$ as a novel Group 13 chalcogenide precursor compound (wherein M is In and Ga; E is a chalcogen element selected from S and Se; and $R_1$ and $R_2$ are each independently $C_1$-$C_6$ alkyl) in Korean Patent Publication No. 2003-0023385. In addition, the present inventors have reported an organicmetallic compound in the form of $M(E_2CNR_1R_2)_2$, $M'(E_2CNR_1R_2)_3$ (wherein M is Zn, Cd or Hg; E is a chalcogen element selected from S and Se; and $R_1$ and $R_2$ are each independently $C_1$-$C_6$ alkyl) as a novel Group 12 or 13 chalcogenide precursor for a thin film. In accordance with this invention, the chalcogenide thin film is composed of a chacogen element and a Group 12 or 13 metal in a ratio of 1:1 and 2:3.

To fabricate high-purity $CuInS_2$ thin films, the present inventors had earnestly researched to obtain metal chalcogenide precursors capable of avoiding the use of toxic materials (e.g., $H_2S$), comprising Cu, In and S with a constant composition, and being chemically deposited at a relatively low temperature. As a result, the present inventors have obtained $CuInS_2$ thin films free of impurities by developing an asymmetric copper precursor and an indium-sulfur-containing precursor, each having stability against air and heat, and sequentially depositing the precursors on a substrate by MOCVD. Furthermore, the present invention has finally completed by confirming fabrication of $In_2S_3$ thin films from the $CuInS_2$ thin films.

SUMMARY OF THE INVENTION

The present invention has been made in view of the problems of the prior art, and it is one object of the present invention to provide a method for fabricating a $CuInS_2$ thin film by metal-organic chemical vapor deposition (MOCVD).

It is another object of the present invention to provide a $CuInS_2$ thin film fabricated by the method.

It is another object of the present invention to provide a method for fabricating an $In_2S_3$ thin film by depositing an indium-sulfur-containing precursor on the $CuInS_2$ thin film.

It is yet another object of the present invention to provide an $In_2S_3$ thin film fabricated by the method.

In accordance with one aspect of the present invention for achieving the above objects, there is provided a method for fabricating a $CuInS_2$ thin film comprising: depositing an asymmetric copper precursor selected from copper ethylbutyrylacetate by the following Formula 1 and copper ethylisobutyrylacetate by the following Formula 2, and an indium-sulfur-containing precursor by the following Formula 3 on a substrate.

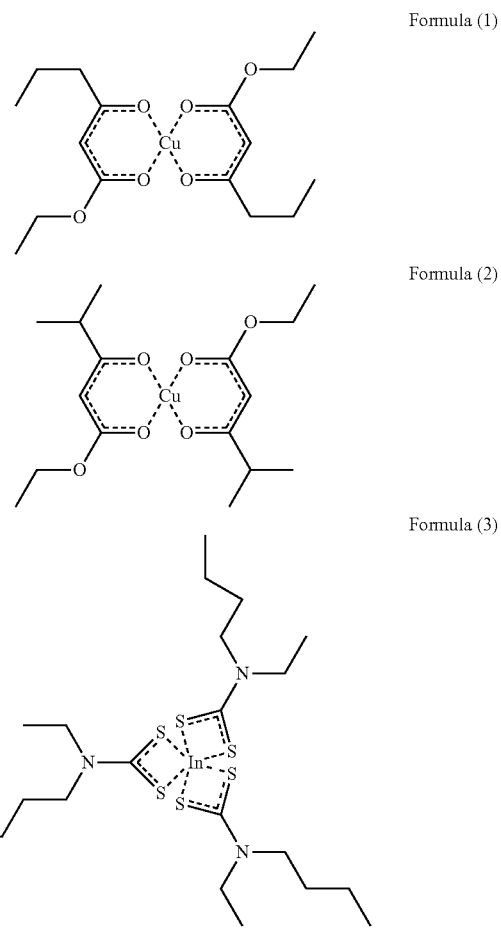

Formula (1)

Formula (2)

Formula (3)

More specifically, the method may comprise the steps of:
(1) fabricating a copper thin film by depositing an asymmetric copper precursor selected from copper ethylbutyrylacetate represented of Formula 1 and copper ethylisobutyrylacetate represented of Formula 2 on a substrate by metal-organic chemical vapor deposition (MOCVD); and
(2) fabricating a $CuInS_2$ thin film by depositing an indium-sulfur-containing precursor of Formula 3 on the surface of the copper thin film by metal-organic chemical vapor deposition (MOCVD).

The method may further comprise: after the step (2), subjecting the $CuInS_2$ thin film to thermal processing.

The deposition of the asymmetric copper precursor in the step (1) may be carried out under argon atmosphere or vacuum by metal-organic chemical vapor deposition (MOCVD) to fabricate a copper thin film. At this time, the deposition may be carried out under an argon atmosphere at a bubbler temperature of 80° C. to 120° C. and a substrate temperature of 320° C. to 360° C. for 2 to 3 hours by metal-organic chemical vapor deposition (MOCVD).

In addition, the deposition of the asymmetric copper precursor in the step (1) may be carried out under vacuum at a bubbler temperature of 80° C. to 120° C. and a substrate temperature of 300° C. to 310° C. for 3 to 5 hours by metal-organic chemical vapor deposition (MOCVD).

The deposition of the indium-sulfur-containing precursor in the step (2) may be carried out under argon atmosphere or vacuum by metal-organic chemical vapor deposition (MOCVD) to fabricate a $CuInS_2$ thin film on the copper thin film.

The deposition of the indium-sulfur-containing precursor in the step (2) may be carried out under an argon atmosphere vacuum at a bubbler temperature of 150° C. to 180° C. and a substrate temperature of 350° C. to 450° C. for 30 to 300 min by metal-organic chemical vapor deposition (MOCVD).

The substrate may be a glass or an ITO (indium tin oxide) glass.

In accordance with another aspect of the present invention, there is provided a $CuInS_2$ thin film fabricated by the method, the $CuInS_2$ thin film having a tetragonal structure and a band gap of 1.4 to 1.6 eV.

The $CuInS_2$ thin film may be used as a light-absorbing layer of a solar cell.

In accordance with another aspect of the present invention, there is provided a method for fabricating an $In_2S_3$ thin film comprising: subjecting the $CuInS_2$ thin film fabricated by the method according to the present invention to thermal processing at 350° C. to 450° C. for 60 to 180 minutes; and depositing an indium-sulfur-containing precursor of Formula 3 on the $CuInS_2$ thin film by metal-organic chemical vapor deposition (MOCVD).

The deposition of the indium-sulfur-containing precursor may be carried out under argon atmosphere or vacuum at a bubbler temperature of 150° C. to 180° C. and a substrate temperature of 350° C. to 450° C. for 30 to 300 minutes.

In accordance with yet another aspect of the present invention, there is provided an $In_2S_3$ thin film for a solar cell fabricated by the method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
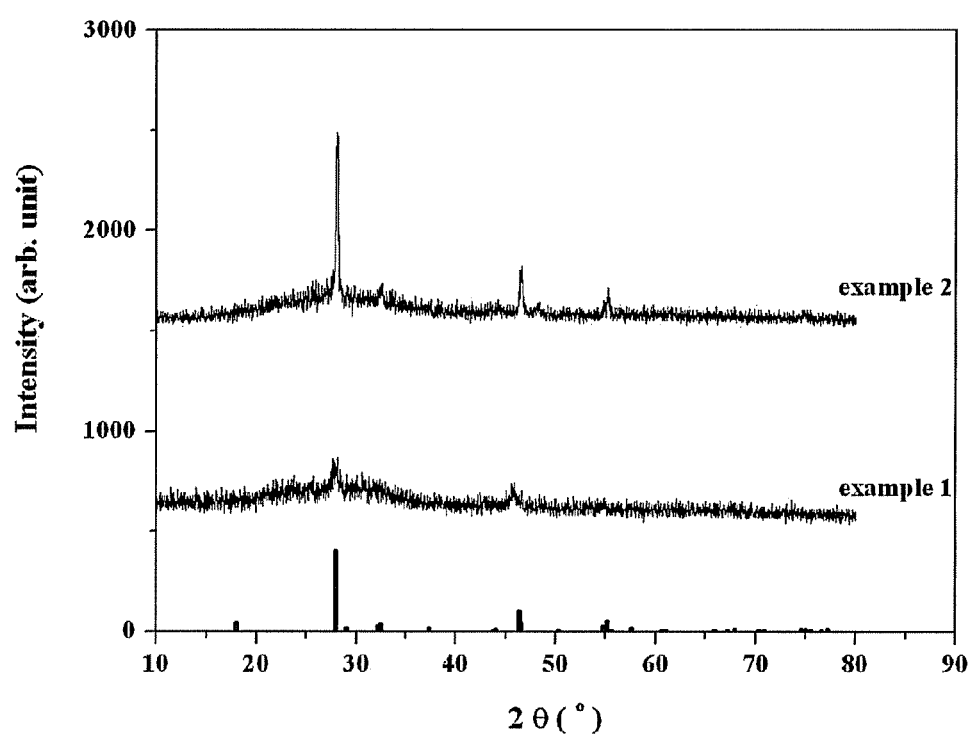
FIG. 1 shows an X-ray diffraction (XRD) result of $CuInS_2$ thin films fabricated under an argon atmosphere in accordance with Examples 1 and 2.

The present invention will now be described in greater detail with reference to the accompanying drawings.

In one aspect, the present invention is directed to a method for fabricating a $CuInS_2$ thin film by depositing an asymmetric copper precursor selected from copper ethylbutyrylacetate and copper ethylisobutyrylacetate, and an indium-sulfur-containing precursor on a substrate.

More specifically, the fabrication of a $CuInS_2$ thin film according to the present invention is carried out by depositing an asymmetric copper precursor on a substrate by metal-organic chemical vapor deposition (MOCVD) and depositing an indium-sulfur-containing precursor on the copper precursor by MOCVD. According to the method, the asymmetric copper precursor and the indium-sulfur-containing precursor with superior stability against air and heat are simultaneously introduced through a single process, rather than being dissolved in a solvent. As a result, a high-purity $CuInS_2$ thin film can be fabricated at a low temperature for a reduced deposition time, as compared to conventional methods. The use of MOCVD enables fabrication of a $CuInS_2$ thin film by means of a simple manner. A $CuInS_2$ thin film with a constant composition can be fabricated even under vacuum as well as an argon (Ar) atmosphere. Accordingly, the method has an advantage of saving in fabrication costs.

More specifically, the method comprises: (1) preparing a copper thin film by depositing an asymmetric copper precursor selected from copper ethylbutyrylacetate represented by the following Formula 1 and copper ethylisobutyrylacetate represented by the following Formula 2 on a substrate by MOCVD; and (2) fabricating a $CuInS_2$ thin film by depositing an indium-sulfur-containing precursor represented by the following Formula 3 on the copper thin film by MOCVD.

The method may further comprise, after step (2), subjecting the $CuInS_2$ thin film to thermal processing.

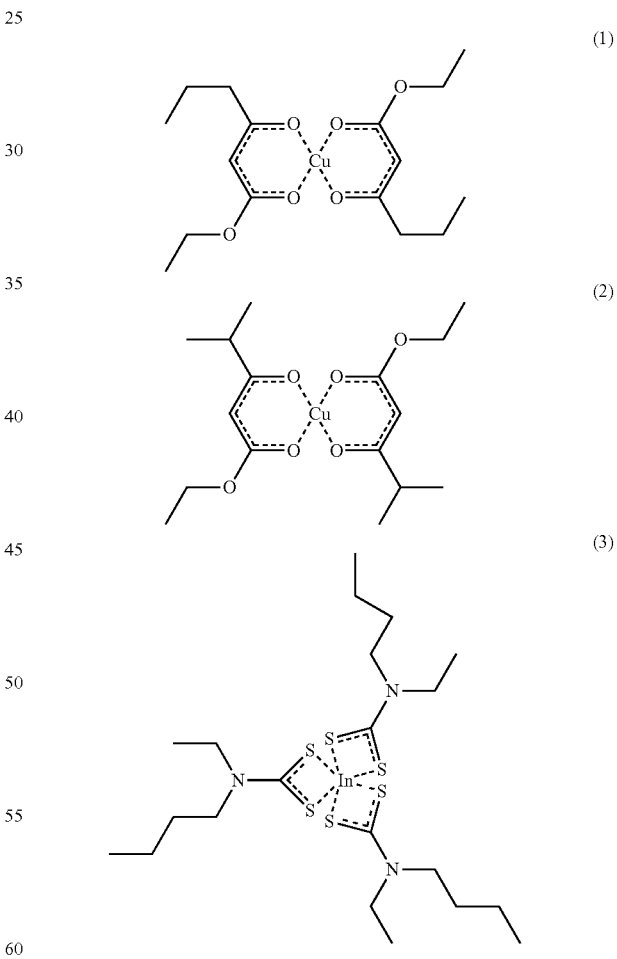

The asymmetric copper (II) precursors of the following Formula 1 and 2 used in fabrication of a $CuInS_2$ thin film by chemical vapor deposition of the present invention have superior thermal stability, and exhibits considerably high volatility due to low thermal decomposition temperature with fluorine-free groups, when compared to copper (I) precursors.

The indium-sulfur-containing precursor represented by the following Formula 3 comprises one indium bounded to six sulfurs, thus minimizing loss of sulfur. Accordingly, sulfur has high volatility which is common to Group 16 elements, thus undergoing no great loss. For this reason, there can be fabricated a high-purity thin film which is composed of copper, indium and sulfur in a ratio of 1:1:2 without loss of a specific element.

The substrate used in deposition of the present invention may be a microslide glass or an ITO (indium tin oxide) glass.

In the fabrication method of the $CuInS_2$ thin film accomplished by MOCVD, the composition of thin films and the thickness of crystalline can be adjusted to a desired level by controlling the deposition temperature and deposition time.

Specifically, the step (1) of fabricating a copper thin film may be carried out using MOCVD under an argon atmosphere or vacuum. Under an argon atmosphere, the deposition of the asymmetric copper precursor is preferably carried out at a bubbler temperature of 80° C. to 120° C. and a substrate temperature of 320° C. to 360° C. for 2 to 3 hours. When the bubbler temperature is lower than 80° C., a deposition rate is disadvantageously reduced due to low vapor pressure. On the other hand, when the bubbler temperature is higher than 140° C., the precursor is unexpectedly decomposed.

The substrate temperature is involved as a substantial deposition temperature. When the substrate temperature is lower than 320° C., the deposition rate is very small, or crystallinity of thin films is poor. On the other hand, when the substrate temperature is higher than 360° C., the thin film is damaged or oxidized. Therefore, the deposition is preferably carried out at a temperature within the range. The deposition time is preferably 2 to 3 hours. When the deposition time exceeds 3 hours, a thin film has an excessive thickness, thus having an undesired composition therein.

Meanwhile, in a case where the step (1) of fabricating a copper thin film is carried out under vacuums, the deposition is preferably carried out at a bubbler temperature of 80° C. to 120° C. and a substrate temperature of 300° C. to 310° C. for 3 to 5 hours. When the substrate temperature is higher than 350° C., copper oxide is created on a copper thin film. Therefore, the deposition is preferably carried out at the substrate temperature within the range.

When the deposition time is smaller than 3 hours, a copper thin film has an excessively small thickness. On the other hand, when the deposition time exceeds 5 hours, a copper thin film has an excessively large thickness and undergoes partial oxidation. Therefore, the deposition is preferably carried out for a time within the range.

Similarly, the step (2) of fabricating a copper thin film may be carried out under an argon atmosphere or vacuum. During the step (2), an indium-sulfur-containing precursor is deposited on the surface of the copper thin film.

At this time, the deposition is preferably carried out under an argon atmosphere or vacuum at a bubbler temperature of 150° C. to 180° C. and a substrate temperature of 350° C. to 450° C. for 30 to 300 minutes. The bubbler temperature affects deposition rate and volatility. By preventing the precursor from being decomposed in a bubbler, the repeated deposition can be performed without loss of a specific element. When the bubbler temperature is lower than 150° C., a deposition rate is excessively small. On the other hand, when the bubbler temperature exceeds 220° C., the precursor is unexpectedly decomposed.

Then, the deposition is carried out at a deposition temperature of 350° C. to 450° C. for a deposition time of 30 to 300 minutes. When the deposition temperature and time are out of the defined range, there occur problems of the thin film, e.g., the undesired composition, non-uniform thickness and damage. That is to say, the longer the deposition time, the thicker the thin film. Accordingly, the conditions can be controlled in accordance with the intended composition of the thin film and the desired thickness of crystalline.

In another aspect, the present invention is directed to a $CuInS_2$ thin film fabricated by the method.

The $CuInS_2$ thin film of the present invention has the same tetragonal structure as those of conventional $CuInS_2$ thin films generally employed as a light-absorbing layer of solar cells. The structure of the $CuInS_2$ thin films was confirmed from X-ray diffraction (XRD) analysis (Refer to FIGS. 1 and 2). The band gap of the thin films is 1.4 to 1.6 eV. Accordingly, the $CuInS_2$ thin film of the present invention can be used as a light-absorbing layer of solar cells.

In addition, the crystalline size of the $CuInS_2$ thin film can be adjusted to a desired level by controlling the deposition temperature and deposition time, while being free of impurities. Further, the thin film is composed of copper, indium and sulfur in a composition ratio of 1:1:2 (FIGS. 4 to 8) and has high-purity.

In another aspect, the present invention is directed to a method for fabricating an $In_2S_3$ thin film, the method comprising subjecting the $CuInS_2$ thin film to thermal processing at 350° C. to 450° C. for 60 to 180 minutes and depositing an indium-sulfur-containing precursor of the following formula 3 on the $CuInS_2$ thin film by MOCVD.

The deposition of the indium-sulfur-containing precursor is preferably carried out under an argon atmosphere or vacuum at a bubbler temperature of 150° C. to 180° C. and a substrate temperature of 350° C. to 450° C. for 30 to 300 minutes.

The $In_2S_3$ thin film fabricated by the method can be used as a material for windows of solar cells. That is, the $In_2S_3$ thin film can be utilized as a substitute for CdS which are conventionally used as a material for windows of solar cells, and enables simplification in the fabrication process of solar cells.

Hereinafter, the present invention will be explained in more detail with reference to the following examples. However, these examples are given for the purpose of illustration and are not to be construed as limiting the scope of the invention.

EXAMPLES

Preparative Example 1

Preparation of Copper Ethylbutyrylacetate

By metal substitution of sodium ethylbutyrylacetate with $CuCl_2$, there was prepared an asymmetric Cu (II) precursor, $Cu(\beta\text{-diketone})_2$, namely, copper ethylbutyrylacetate of Formula 1.

Preparative Example 2

Preparation of Copper Ethylisobutyrylacetate

By metal substitution of sodium ethylisobutyrylacetate with $CuCl_2$, there was prepared an asymmetric Cu (II) precursor, $Cu(\beta\text{-diketone})_2$, namely, copper ethylisobutyrylacetate of Formula 2.

Example 1

Fabrication of $CuInS_2$ Thin Film (A-CIS-1) Under Argon Atmosphere

Step 1: Fabrication of Copper Thin Film Under Argon Atmosphere

The copper ethylbutyrylacetate precursor prepared in Preparative Example 1 was recrystallized using a common technique. A washed clean substrate was fixed in deposition equipment. Prior to the deposition, the inside of a reactor was repeatedly cleaned with argon (Ar) as a carrier gas, and was stood under vacuum for one hour or more. As a result, residues such as oxygen and water, which are in danger of being incorporated in a thin film and becoming impurities therein, were removed from the inwalls of the reactor. Then, the copper ethylbutyrylacetate precursor was put in an evaporator equipped with a bubbler. The copper ethylbutyrylacetate precursor was deposited on a glass substrate under an argon (Ar) atmosphere introduced from an argon (Ar) gas supplier at a bubbler temperature of 120° C., a transporting tube temperature of 140° C., which is an increase 20° C. of the bubbler temperature, and a substrate temperature of 350° C. for 3 hours, followed by thermal processing under the same temperature conditions for 10 minutes. As a result, a copper thin film was fabricated.

Step 2: Fabrication of $CuInS_2$ Thin Film Under Argon Atmosphere

Indium ethylbutyldithiocarbamate was deposited on the surface of the copper thin film including the glass substrate (Cu/glass).

More specifically, an indium-sulfur-containing precursor recrystallized by a common technique, i.e., indium ethylbutyldithiocarbamate was introduced into an evaporator equipped with a bubbler, and was deposited on the Cu/glass under an argon (Ar) atmosphere introduced from an argon (Ar) gas supplier at a bubbler temperature of 150° C. to 180° C., a transporting tube temperature of 200° C., and a substrate temperature of 430° C. for 4 hours, followed by thermal processing under the same temperature conditions for 10 minutes. As a result, a $CuInS_2$ thin film was fabricated.

Example 2

Fabrication of $CuInS_2$ Thin Film (A-CIS-2) Under Argon Atmosphere

A $CuInS_2$ thin film (A-CIS-2) was fabricated in the same manner as Example 1 except that the deposition of the $CuInS_2$ thin film in the step 2 was carried out for 300 minutes.

Example 3

Fabrication of $CuInS_2$ Thin Film (V-CIS-1) Under Vacuum

Step 1: Fabrication of Copper Thin Film Under Vacuum

The copper thin film was fabricated in the same manner as the step 1 of Example 1 except that the copper ethylbutyrylacetate precursor was deposited on a glass substrate in the absence of a carrier gas under vacuum at a bubbler temperature of 80° C. to 120° C., a transporting tube temperature of 140° C., and a substrate temperature of 310° C. In the case where the deposition is carried out under vacuum at 350° C. or higher, there is a risk that copper oxide creates on the copper thin film. For this reason, the substrate temperature was maintained to 310° C. The deposition was carried out at a pressure of $1\times10^{-3}$ torr for 3 hours.

Step 2: Fabrication of $CuInS_2$ Thin Film Under Vacuum

A $CuInS_2$ thin film was fabricated in the same manner as Example 1 except that the deposition of the $CuInS_2$ thin film in the step 2 of Example 1 was carried out in the absence of a carrier gas under vacuum conditions for 50 minutes.

Example 4

Fabrication of $CuInS_2$ Thin Film (V-Cis-2) Under Vacuum

A $CuInS_2$ thin film (V-CIS-2) was fabricated in the same manner as Example 1 except that the deposition of the $CuInS_2$ thin film in the step 2 of Example 3 was carried out for 60 minutes.

Example 5

Fabrication of $CuInS_2$ Thin Film (V-CIS-3) Under Vacuum

A $CuInS_2$ thin film (V-CIS-3) was fabricated in the same manner as Example 1 except that the deposition of the $CuInS_2$ thin film in the step 2 of Example 3 was carried out for 70 minutes.

Example 6

Fabrication of $CuInS_2$ Thin Film Under Argon Atmosphere

A $CuInS_2$ thin film was fabricated in the same manner as Example 1 except that the copper ethylisobutyrylacetate prepared in Preparative Example 2 was used as a copper precursor instead of the copper ethylbutyrylacetate, and an ITO-glass was used as a substrate instead of the glass.

Example 7

Fabrication of $CuInS_2$ Thin Film Under Vacuum

A $CuInS_2$ thin film was fabricated in the same manner as Example 3 except that the copper ethylisobutyrylacetate prepared in Preparative Example 2 was used as a copper precursor instead of the copper ethylbutyrylacetate, and an ITO-glass was used as a substrate instead of the glass.

Example 8

Fabrication of $In_2S_3$ Thin Film Under Argon Atmosphere

Indium ethylbutyldithiocarbamate was deposited on the thermal-processed $CuInS_2$ thin film in Example 1 under argon atmosphere to fabricate an $In_2S_3$ thin film. At this time, the introduction method of an indium ethylbutyldithiocarbamate precursor, deposition temperature, and deposition time used herein was the same as in the step 2 of Example 1.

Example 9

Fabrication of $In_2S_3$ Thin Film Under Vacuum

Indium ethylbutyldithiocarbamate was deposited on the thermal-processed $CuInS_2$ thin film in Example 3 under vacuum to fabricate an $In_2S_3$ thin film. At this time, the introduction method of an indium ethylbutyldithiocarbamate precursor, deposition temperature, and deposition time used herein was the same as in the step 2 of Example 3.

Figure 3:
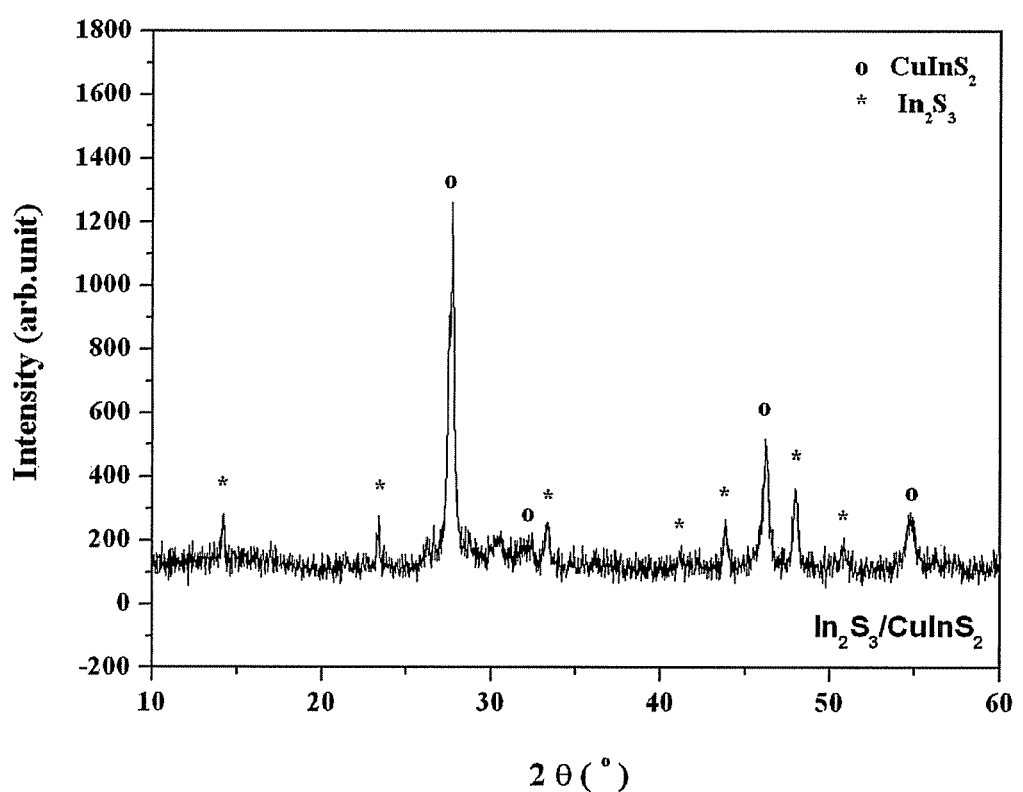
FIG. 3 shows an X-ray diffraction (XRD) result of a $CuInS_2$ thin film and an $In_2S_3$ thin film fabricated under vacuum in accordance with Example 9.

FIG. 3 shows an X-ray diffraction result of the $In_2S_3$ thin film fabricated under vacuum. It could be confirmed from FIG. 3 that $In_2S_3$ thin films were formed posterior to $CuInS_2$ thin films. The fabrication of an $In_2S_3$ thin film with a small thickness posterior to a $CuInS_2$ thin film can be demonstrated from the facts that there was no peak for other materials (e.g., $In_2O_3$ or $In_xS_y$), and that $CuInS_2$ and $In_2S_3$ represented all weak peaks.

Experimental Example 1

Evaluation for Characteristics of $CuInS_2$ Thin Film

To evaluate some characteristics of the $CuInS_2$ thin films fabricated in Examples 1 to 5, the structure of the $CuInS_2$ thin films was observed using X-ray diffractor (XRD), field emission scanning electron microscope (FE-SEM) and ultraviolet-visible spectrophotometer (UV/VIS). The results were shown in Table 1 and FIGS. 1 to 5.

Figure 2:
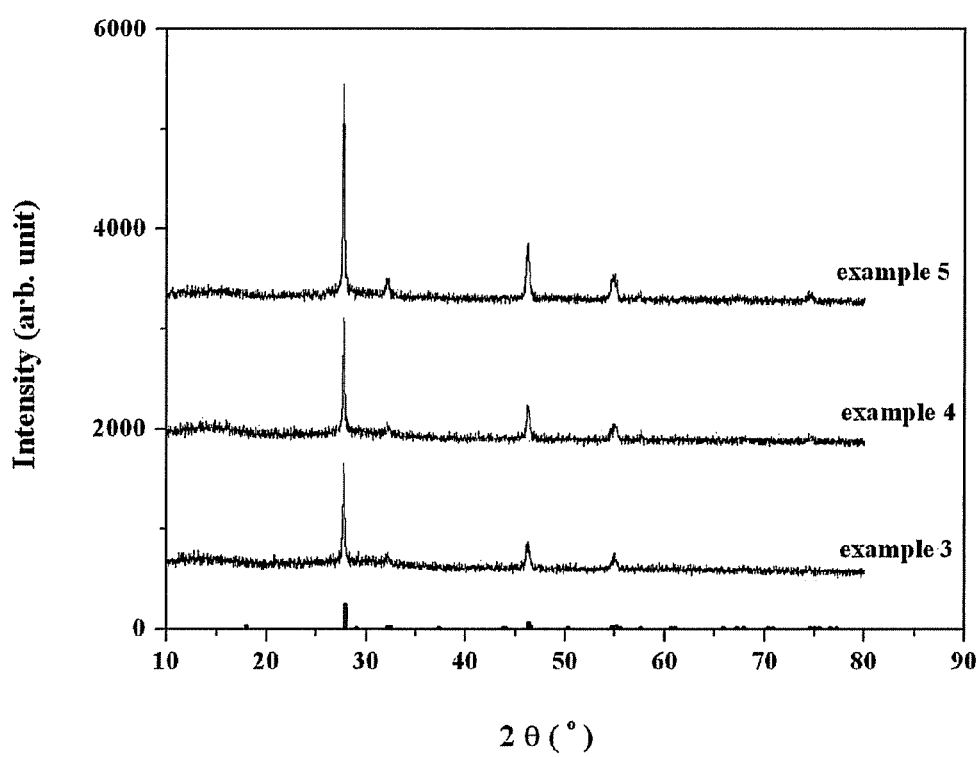
FIG. 2 shows an X-ray diffraction (XRD) result of $CuInS_2$ thin films fabricated under vacuum in accordance with Examples 3 to 5.

FIG. 1 shows an X-ray diffraction (XRD) result of the $CuInS_2$ thin films fabricated under argon atmosphere in accordance with Examples 1 and 2. FIG. 2 shows an X-ray diffraction (XRD) result of the $CuInS_2$ thin films fabricated under vacuum in accordance with Examples 3 to 5.

Thick vertical lines shown on the bottom in FIGS. 1 and 2 represents a graph of a conventional $CuInS_2$ having a tetragonal structure [JCPDS Cards No. 27-0159]. Based on the graph, it could be confirmed that all of the $CuInS_2$ thin films fabricated under argon atmosphere in Examples 1 and 2 and the $CuInS_2$ thin films fabricated under vacuum in Examples 3 to 5 have a tetragonal structure.

Further, it can be seen from FIG. 3 that after the $CuInS_2$ thin films, $In_2S_3$ thin films were fabricated by depositing an indium-sulfur-containing precursor on the $CuInS_2$ thin films via MOCVD.

Figure 4:
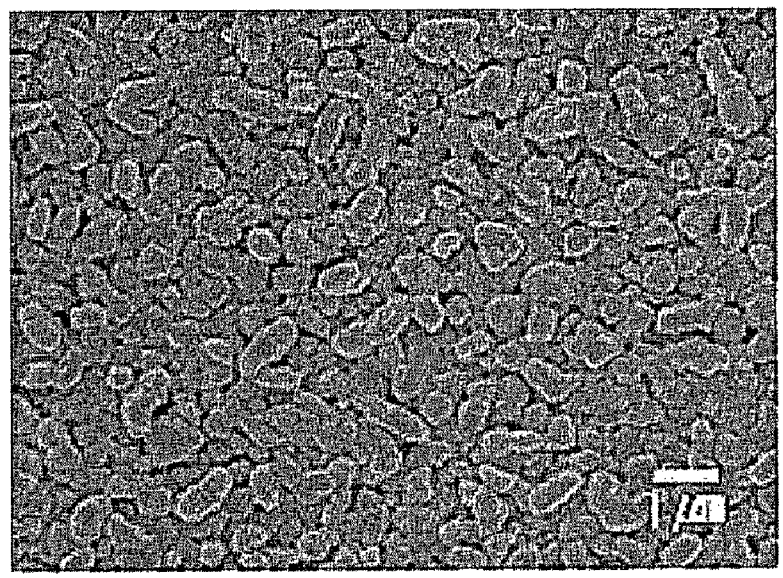
FIGS. 4 and 5 are FE-SEM (field emission scanning electron microscope) images showing the surface of $CuInS_2$ thin films fabricated under an argon atmosphere in accordance with Examples 1 and 2, respectively.
Figure 5:
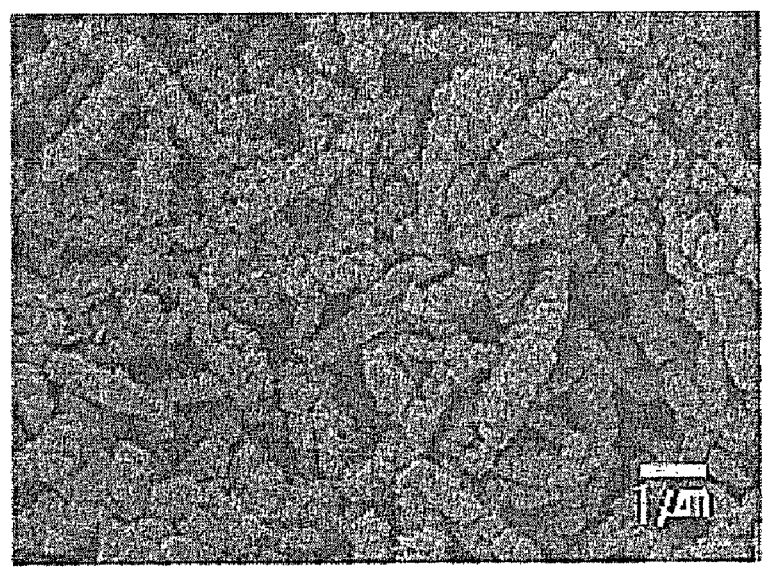

FIGS. 4 and 5 show a field emission scanning electron microscope (FE-SEM) result of the $CuInS_2$ thin films fabricated under argon atmosphere in accordance with Examples 1 and 2. As can be seen from FIGS. 4 and 5, crystalline with a size of 1 to 5 μm were developed on the surface of the thin films.

Figure 6:
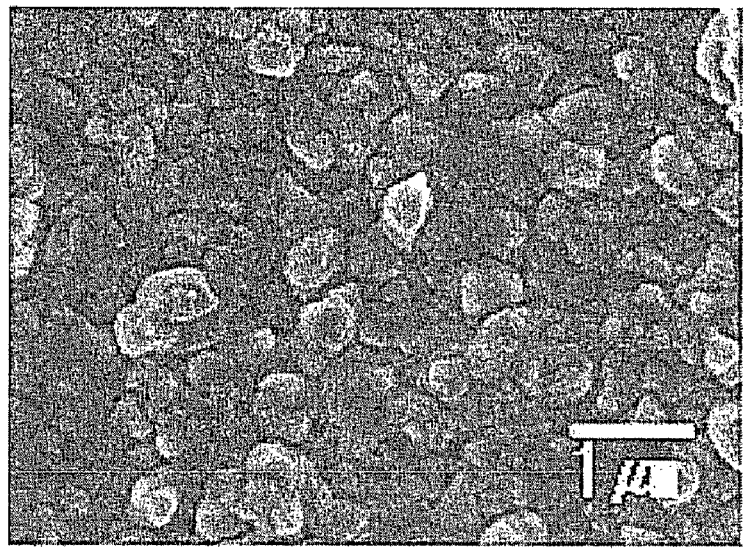
FIGS. 6 to 8 are FE-SEM (field emission scanning electron microscope) images showing the surface of $CuInS_2$ thin films fabricated under vacuum in accordance with Examples 3 to 5, respectively.
Figure 7:
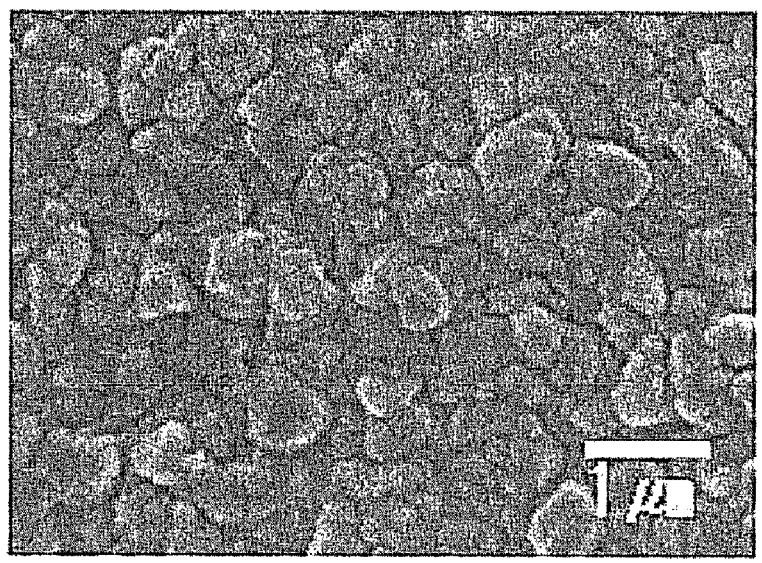
Figure 8:
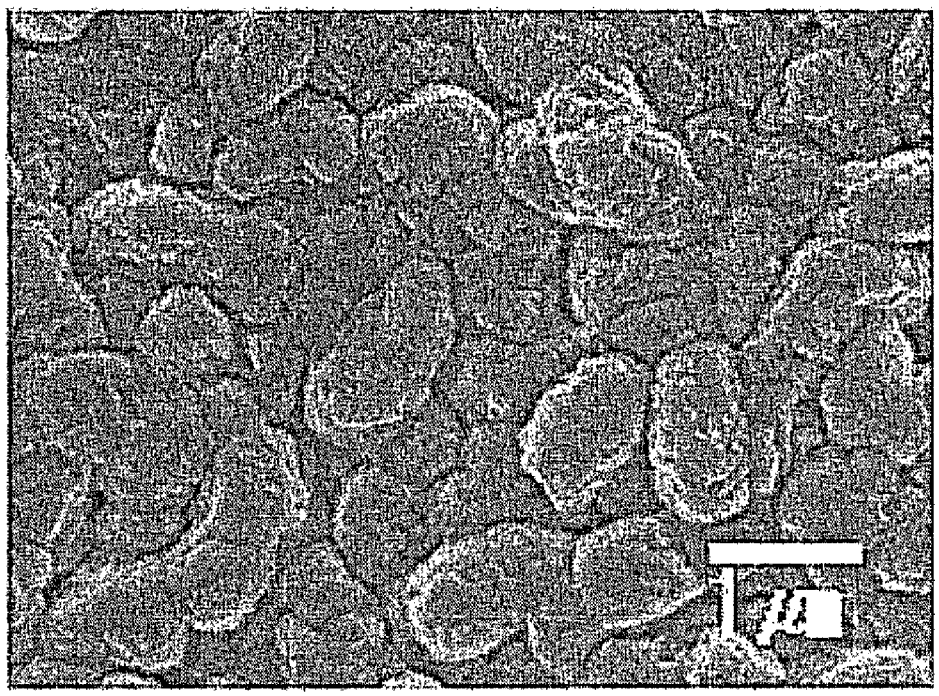

FIGS. 6 to 8 show a field emission scanning electron microscope (FE-SEM) result of the $CuInS_2$ thin films fabricated under vacuum in accordance with Examples 3 to 5. As can be seen from FIGS. 6 to 8, crystalline with a size of 250 to 1,000 nm were developed on the surface of the thin films. As a result, the $CuInS_2$ thin films fabricated in accordance with the methods of the present invention has high crystallinity on the surface thereof and uniform distribution of the crystalline.

TABLE 1

Characteristics of $CuInS_2$ thin films

| Ex. No. | Thin film No. | Deposition atmosphere | Deposition time (min) | Composition ratio S/(Cu + In) | Cu/In | Band gap (eV) | Thin film thickness |
|---|---|---|---|---|---|---|---|
| Ex. 1 | A-CIS-1 | argon | 240 | 0.9 | 0.9 | 1.53 | 1.44 |
| Ex. 2 | A-CIS-2 | argon | 300 | 0.9 | 0.8 | 1.58 | 1.84 |
| Ex. 3 | V-CIS-1 | vacuum | 50 | 0.8 | 1.1 | 1.42 | 0.42 |
| Ex. 4 | V-CIS-2 | vacuum | 60 | 0.9 | 1.0 | 1.42 | 0.85 |
| Ex. 5 | V-CIS-3 | vacuum | 70 | 0.9 | 0.8 | 1.44 | 1.00 |

As can be seen from the date shown in Table 1, as the deposition time is increased and argon as a carrier gas is used, the thickness of the $CuInS_2$ thin films fabricated in Examples 1 to 5 is increased.

In particular, the composition ratio of copper, indium and sulfur contained in the $CuInS_2$ thin films was maintained to 1:1:2 without loss of a specific element during the deposition.

As a result, it is apparent that the $CuInS_2$ thin films contain no impurities and have a constant composition.

The $CuInS_2$ thin films deposited under vacuum (Examples 3 to 5) showed a low bad gap (i.e., 1.4 eV), as compared to the $CuInS_2$ thin films deposited under argon atmosphere (Examples 1 and 2).

According to the methods of the present invention, the asymmetric copper precursor and the indium-sulfur-containing precursor with superior stability against air and heat are simultaneously introduced through a single process, rather than being dissolved in a solvent. The use of metal-organic chemical vapor deposition (MOCVD) for deposition enables economical fabrication of a $CuInS_2$ thin film in a simple manner. In addition, a $CuInS_2$ thin film with a constant composition can be fabricated even under vacuum as well as an argon (Ar) atmosphere. Accordingly, the method has an advantage of saving in fabrication costs.

As apparent from the above description, the present invention suggests a metal chalcogenide precursor composed of copper, indium and sulfur with a constant composition ratio and being chemically deposited at low temperature and a high-purity $CuInS_2$ thin film fabricated by depositing the metal chalcogenide precursor by metal-organic chemical vapor deposition (MOCVD).

By the introduction of MOCVD, a method for fabricating a $CuInS_2$ thin film according to the present invention enables control of the composition of thin films and the thickness of crystalline.

The $CuInS_2$ thin film fabricated by MOCVD according to the method enables easy doping of silver, gallium, selenium thereon, thus being applied to solar cells.

Since an $In_2S_3$ thin film is fabricated through a simplified consecutive process of the present invention, it can be utilized as a substitute for CdS, which are conventionally used as a material for windows of solar cells, thus contributing to simplification in the fabrication process of solar cells.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a three-component $CuInS_2$ thin film comprising:

(1) fabricating a copper thin film by depositing an asymmetric copper precursor selected from the group consisting of copper ethylbutyrylacetate of Formula 1 and copper ethylisobutyrylacetate of Formula 2 on a substrate by metal-organic chemical vapor deposition (MOCVD); and (2) fabricating a $CuInS_2$ thin film by depositing an indium-sulfur-containing precursor of Formula (3) on the surface of the copper thin film by metal-organic chemical vapor deposition (MOCVD), wherein the deposition of the indium-sulfur-containing precursor in the step (2) is carried out a substrate temperature of 350° C. to 430° C., the composition ratio of copper, indium and sulfur components contained in the $CuInS_2$ thin film is 1:1:2, and the thin film thickness is 0.25 to 5 μm.

(Formula 1)

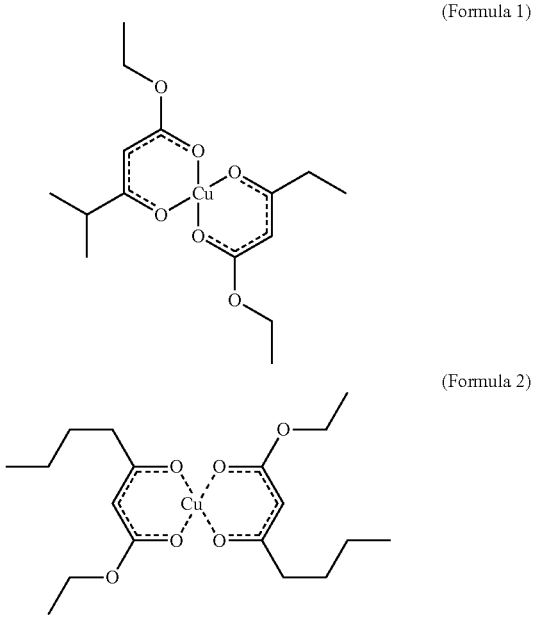

(Formula 2)

2. The method for fabricating a CuInS$_2$ thin film according to claim 1, further comprising:
after the step (2), subjecting the CuInS$_2$ thin film to thermal processing.

3. The method for fabricating a CuInS$_2$ thin film according to claim 1, wherein the deposition of the asymmetric copper precursor in the step (1) is carried out under argon atmosphere or vacuum by metal-organic chemical vapor deposition (MOCVD).

4. The method for fabricating a CuInS$_2$ thin film according to claim 3, wherein the deposition of the asymmetric copper precursor in the step (1) is carried out under argon atmosphere at a bubbler temperature of 80° C. to 120° C. for the asymmetric copper precursor and a substrate temperature of 320° C. to 360° C. for 2 to 3 hours by metal-organic chemical vapor deposition (MOCVD).

5. The method for fabricating a CuInS$_2$ thin film according to claim 3, wherein the deposition of the asymmetric copper precursor in the step (1) is carried out under vacuum at a bubbler temperature of 80° C. to 120° C. for the asymmetric copper precursor and a substrate temperature of 300° C. to 310° C. for 3 to 5 hours by metal-organic chemical vapor deposition (MOCVD).

6. The method for fabricating a CuInS$_2$ thin film according to claim 1, wherein the deposition of the indium-sulfur-containing precursor in the step (2) is carried out under argon atmosphere or vacuum by metal-organic chemical vapor deposition (MOCVD).

7. The method for fabricating a CuInS$_2$ thin film according to claim 6, wherein the deposition of the indium-sulfur-containing precursor in the step (2) is carried out under argon atmosphere or vacuum at a bubbler temperature of 150° C. to 180° C. for the indium-sulfur-containing precursor for 30 to 300 min by metal-organic chemical vapor deposition (MOCVD).

8. The method for fabricating a CuInS$_2$ thin film according to claim 1, wherein the substrate is a glass or an ITO (indium tin oxide) glass.

9. A method for fabricating an In$_2$S$_3$ thin film comprising:
subjecting the CuInS$_2$ thin film fabricated by the method according to claim 1 to thermal processing at 350° C. to 450° C. for 60 to 180 minutes; and
depositing an indium-sulfur-containing precursor of Formula 3 on the CuInS$_2$ thin film by metal-organic chemical vapor deposition (MOCVD).

10. The method for fabricating an In$_2$S$_3$ thin film according to claim 9, wherein the deposition of the indium-sulfur-containing precursor is carried out under argon atmosphere or vacuum at a bubbler temperature of 150° C. to 180° C. for the indium-sulfur-containing precursor and a substrate temperature of 350° C. to 450° C. for 30 to 300 minutes.

* * * * *

UNITED STATES PATENT AND TRADEMARK OFFICE
CERTIFICATE OF CORRECTION

PATENT NO.        : 8,053,029 B2
APPLICATION NO.   : 11/775618
DATED             : November 8, 2011
INVENTOR(S)       : Il Wun Shim et al.

Page 1 of 1

It is certified that error appears in the above-identified patent and that said Letters Patent is hereby corrected as shown below:

In the Claims

Column 13, Claim 1, Line 26 after Formula 2

Insert --  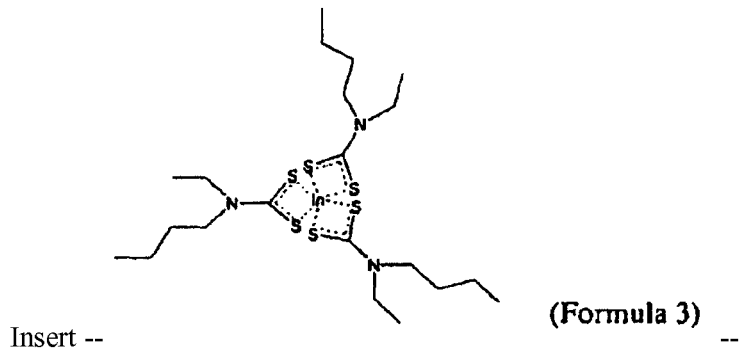 (Formula 3) --

Signed and Sealed this
First Day of July, 2014

Michelle K. Lee
*Deputy Director of the United States Patent and Trademark Office*